United States Patent
Glöckner et al.

(10) Patent No.: US 7,019,532 B2
(45) Date of Patent: Mar. 28, 2006

(54) DEVICE AND METHOD FOR ERROR DIAGNOSIS AT DIGITAL OUTPUTS OF A CONTROL MODULE

(75) Inventors: Knut Glöckner, Chemnitz (DE); Holger Röhle, Burkhardtsdorf (DE); Michael Slanina, Chemnitz (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 10/998,493

(22) Filed: Nov. 29, 2004

(65) Prior Publication Data

US 2005/0151542 A1 Jul. 14, 2005

(30) Foreign Application Priority Data

Dec. 2, 2003 (EP) .................. 03027733

(51) Int. Cl.
*G01R 31/02* (2006.01)
*H04B 3/46* (2006.01)

(52) U.S. Cl. ............... 324/543; 324/76.55; 324/76.82; 340/644; 340/635

(58) Field of Classification Search ............... 324/543
See application file for complete search history.

(56) References Cited

U.S. PATENT DOCUMENTS

| | | | | |
|---|---|---|---|---|
| 4,574,266 A | * | 3/1986 | Valentine | 340/635 |
| 5,623,254 A | | 4/1997 | Brambilla et al. | |
| 5,942,886 A | | 8/1999 | Kelly | |
| 6,812,674 B1 | * | 11/2004 | Hoffman | 320/162 |
| 6,839,875 B1 | * | 1/2005 | Roohparvar | 714/773 |

FOREIGN PATENT DOCUMENTS

EP  0 810 444 A1  12/1997

* cited by examiner

*Primary Examiner*—Anjan Deb
*Assistant Examiner*—John Zhu

(57) ABSTRACT

A device for identifying a wire break between an electrical connection of a digital output and a load includes an evaluation module connected to the electrical connection and a voltage limiter module also connected to the electrical connection for co-determining a voltage value which is present at the evaluation module in the event of the wire break.

13 Claims, 3 Drawing Sheets

US 7,019,532 B2

DEVICE AND METHOD FOR ERROR DIAGNOSIS AT DIGITAL OUTPUTS OF A CONTROL MODULE

CROSS REFERENCE TO RELATED APPLICATIONS

This application claims priority to the European application No. 03027733.9, filed Dec. 2, 2003 and which is incorporated by reference herein in its entirety.

FIELD OF INVENTION

The present invention relates to a device and a method for error diagnosis at digital outputs of a control module. In particular the present invention relates to a device and a method for identifying a wire break between an electrical connection at a digital output of the module and a load connected thereto.

BACKGROUND OF INVENTION

Many variants of control modules with digital outputs are already known. A digital output can thereby have one of the two digital states "digital ONE" or "digital ZERO". The control module controls the load connected to the digital output depending on the state of said digital output.

In automation systems such control modules are used for example to activate a very wide range of actuators, e.g. electromagnetic components and in particular also signal generators. Such actuators have a specific load resistance and are in some instances connected together with a current-limiting series resistor via the corresponding electrical connection to one of the digital outputs of the control module.

If such signal generators are used in automation systems for monitoring purposes for example, the digital output will have one of the two digital states depending on operating state. For example in the case of a fire alarm in normal operation of the automation system, the output of the control module will have the "digital ZERO" state, while in the event of a failure, the "digital ONE" state is present at the output and the signal generator is therefore activated.

If an interruption now occurs between the electrical connection and the signal generator due to a wire break, the actuator can no longer be controlled by the control module and a malfunction results with the failure of the automation system. If, as in the case of the signal generator in the form of a fire alarm, the "digital ZERO" state corresponds to the normal operating state and the "digital ONE" state occurs only rarely, such a malfunction is not identified for quite a long time without additional monitoring. In order to establish such a malfunction promptly, it would be conceivable to send an additional test signal to the electrical connection at regular intervals to test whether the load is still securely connected to the electrical connection.

SUMMARY OF INVENTION

The object of the present invention is to specify a device and a method for error diagnosis at digital outputs of a control module, with which a cable break between an electrical connection at a digital output of a control module and the load connected thereto in particular can be identified in a simple manner in "digital ZERO" state.

This object is achieved by the claims.

By connecting a voltage limiter module and an evaluation module to the electrical connection of a digital output such that, in the event of a wire break between the electrical connection and the load connected thereto, a voltage value also defined by the voltage limiter module is present at the evaluation module, when the digital output has a first "digital ZERO" state, this voltage value can then be compared in the evaluation module with a reference voltage value, whereby a wire break can be identified, diagnosed and reported. Both the inventive device and the inventive method can therefore be used to identify a cable break, without an additional test signal even being required for this. The present invention therefore allows error diagnosis at digital outputs of control modules in the simplest manner.

Further advantageous embodiments and preferred developments of the invention will emerge from the dependent claims.

BRIEF DESCRIPTION OF THE DRAWINGS

The invention and advantageous embodiments of the same are described in more detail using examples with reference to the Figures below, in which.

DETAILED DESCRIPTION OF INVENTION

Figure 1:
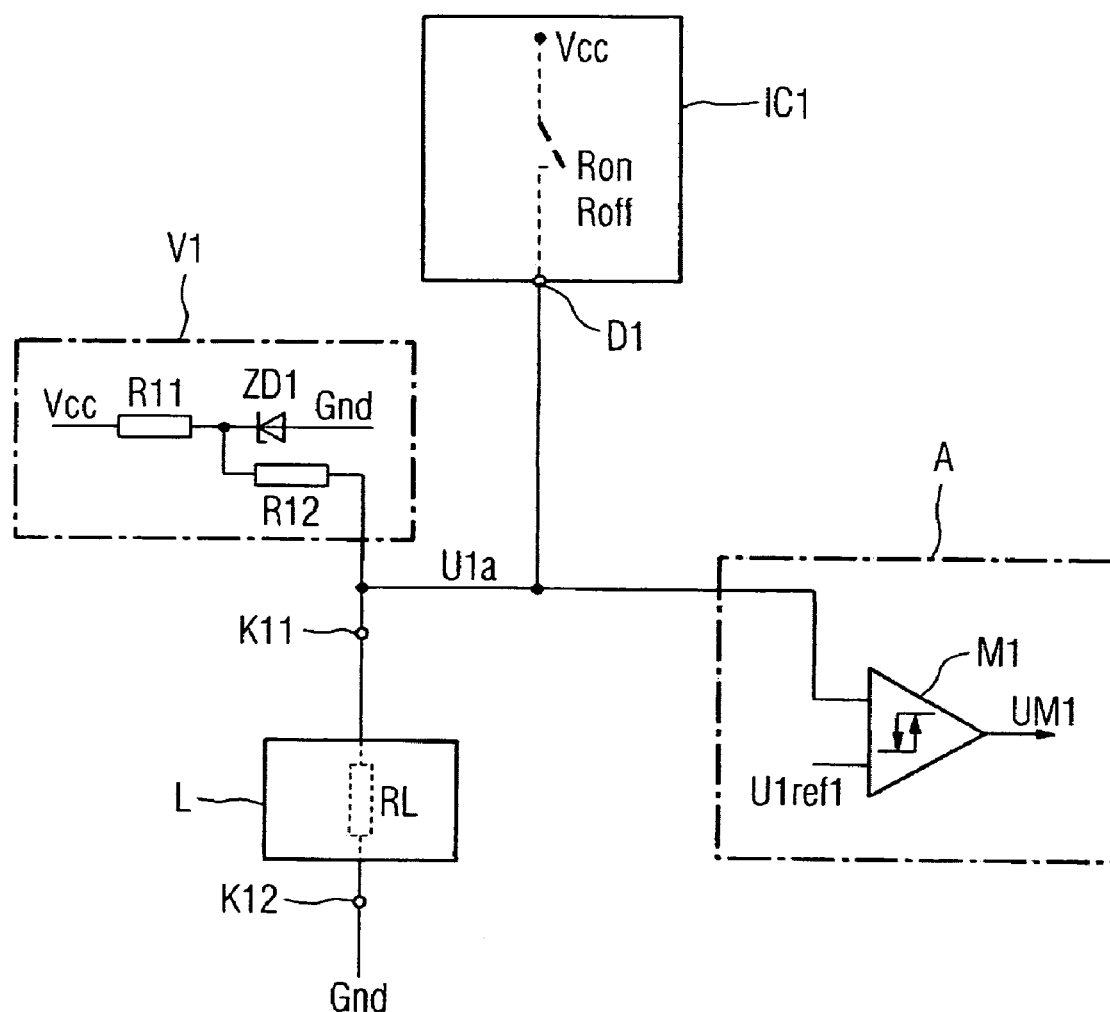
FIG. 1 shows the essential structure of the inventive device.

FIG. 1 shows the state of the digital output D1 of the control module IC1 by means of the switch connected to the voltage Vcc, with a closed switch indicating the "digital ONE" state and an open switch indicating the "digital mere ZERO" state of the digital output D1. In the alternative circuit diagram for this switch the digital output D1 in the. "digital ONE" state is connected via a resistor Ron and in the "digital ZERO" state via a resistor Roff to the supply voltage Vcc, whereby Ron is smaller than Roff. An electrical connection K11 is located at the digital output D1 of the control module IC1, said connection being configured as a terminal for example with the load L to be controlled by the control module IC1 connected to it. This load L can be simulated by a load resistor RL, which, as shown here, is a purely ohmic load but generally also has inductive and capacitive components. The load L, which can for example be a signal generator acting as an actuator, is therefore connected on the one hand by means of the electrical connection K11 to the digital output D and on the other hand via a further electrical connection K12 to earth Gnd. According to the invention a voltage limiter module V1 and an evaluation unit A are now connected between the digital output D and the electrical connection K11. The voltage limiter module V1 is thereby preferably configured as a voltage divider comprising a resistor R11 and a Zener diode ZD1 between the supply voltage Vcc and earth Gnd. This voltage divider is connected to the digital output D1 and the electrical connection K11 via a second resistor R12. The Zener diode ZD1 causes a certain voltage value to be present at the node between R11, R12 and ZD1 depending on the Zener voltage predefined by it. The evaluation unit A serves to measure the voltage value U1a present at the node between the digital output D1 and the electrical connection K11 and to compare it with a reference volt-age U1ref1. If with the digital output D1 in "digital ZERO" state a cable break or some other sort of interruption occurs between the electrical connections K11 and K12, a voltage is injected at said node via the second resistor R12 of the current-limiting circuit V1, so that a voltage value U1a is present between the digital output D1 and the electrical connection K11 and therefore also at the evaluation unit A, which is essentially defined by the Zener voltage of the Zener diode ZD1 of the voltage limiter module V. A comparator M1 in the evaluation unit A compares this voltage value U1a with the preset first voltage reference value U1ref1. If the voltage value U1a is greater than or equal to the voltage reference value U1ref1, the signal UM1 at the output of the comparator M1 will change and thereby indicate the presence of a cable break.

Figure 2:
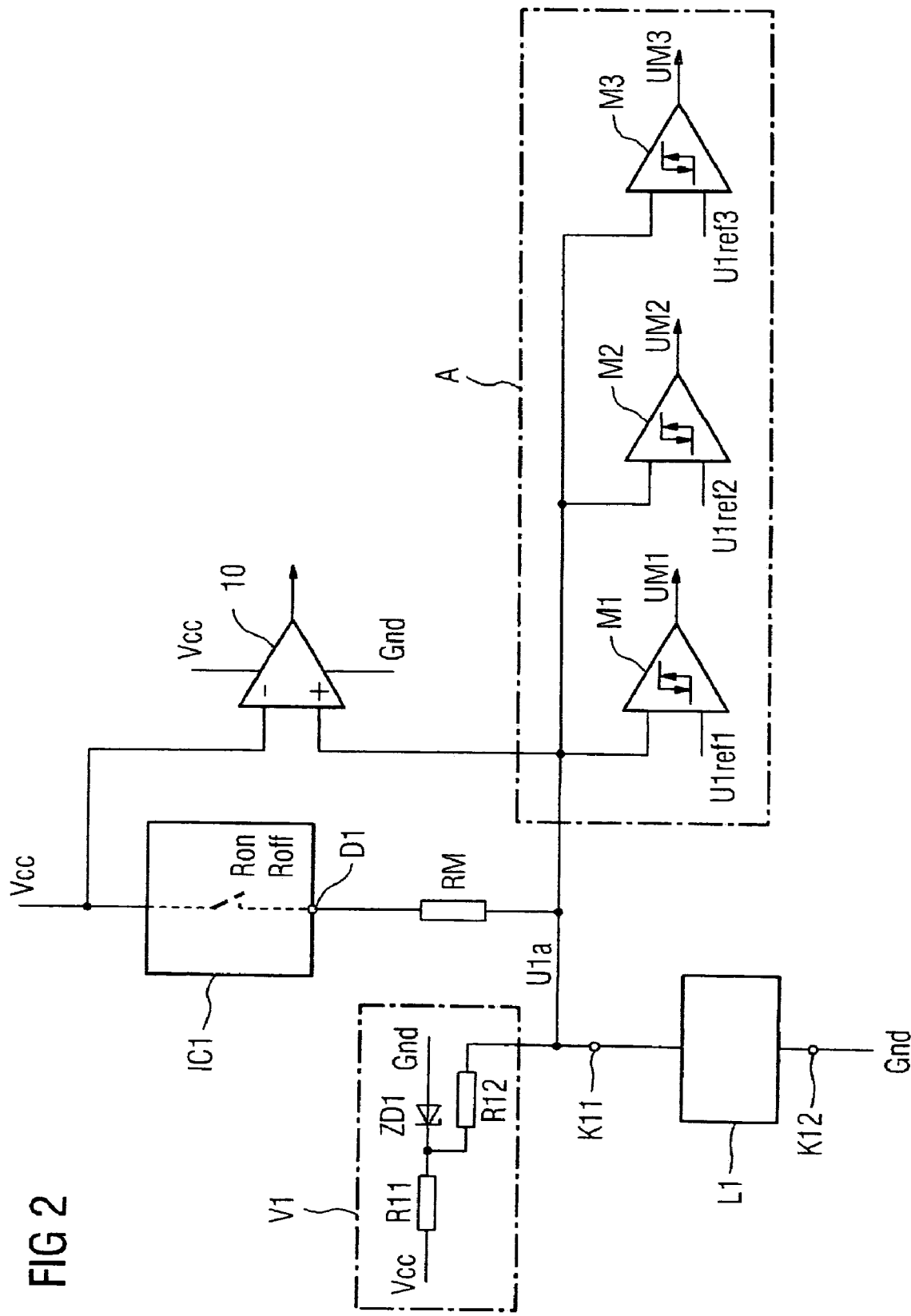
FIG. 2 shows a first example of a circuit arrangement for implementing the inventive method.

FIG. 2 shows an example of a possible embodiment of a circuit arrangement for implementing the inventive method. The corresponding dimensioning of the individual components of the modules V and A for a control module IC1 of type BTS 4141D with a supply voltage of Vcc=24V is also shown here. The actuator L1, which can be connected to the digital output D1 should thereby have a resistance value in the 47 Ohm to 4K Ohm range and an inductivity of up to 1.1 Henry. The circuit arrangement shown in FIG. 2 is thereby designed such that in addition to a cable break, other possible error states, in particular short circuit to supply voltage Vcc and to earth Gnd can be identified and diagnosed between the electrical connection K11 and the load L1. The evaluation unit A has three comparators M1, M2 and M3 for this purpose. The voltage limiter module V1, as already shown in FIG. 1, has a Zener diode ZD1, a first (R11) and a second (R12) resistor. The Zener diode ZD1 is designed such that a Zener Voltage of 8.2V can occur at it. If a cable break should occur between the load L1 and the electri-cal connection K11, or even between the load L1 and a further terminal K12 connecting the load L1 to earth Gnd, with the digital output D1 in the "digital ZERO" state, a voltage value U1a will be established between the electrical connection K1 and the digital output D1, which is defined by the Zener voltage of 8.2V and the voltage drop across the second resistor R12. In the present example this voltage value U1a is compared in the evaluation module A using the comparator M1 of type LM2901 with a preset reference voltage value of U1ref1=5V. As the voltage value U1a is greater than the reference voltage value U1ref1, an output signal UM1 is generated by the comparator K1 to signal the error state cable break, whereupon the cable break can be identified and diagnosed.

In the exemplary embodiment shown in FIG. 2 the two other comparators M2 and M3 are provided, in order to be able to detect and therefore diagnose the error states short circuit to earth (Gnd) and to supply voltage (Vcc). In the case of a short circuit to earth error, a voltage value U1a of only a few millivolts (approx. 5 mV) will now be present between the digital output D1 and the electrical connection K11. This voltage value U1a is compared in the evaluation unit A of the comparator M2 with a preset reference voltage value of U1ref2=11 mV. If the voltage value U1a is smaller than this reference voltage value U1ref2, the comparator M2 generates an output signal UM2 signaling the error state short circuit to earth. Correspondingly in the case of a short circuit to supply voltage Vcc error, a voltage value U1a will correspondingly be present between the digital output D1 and the electrical connection K11, which corresponds approximately to the value of the supply voltage of Vcc=24V. This voltage value is compared in the evaluation module A of a comparator M3 with a preset reference voltage value of U1ref3=15V. As in this case the voltage value U1a is greater than the reference voltage value U1ref3, the comparator M3 generates an output signal UM3 signaling the error state short circuit to supply voltage. For completeness it should be pointed out that with the comparators M1 to M3, and the additional components shown in FIG. 2, i.e. the laboratory resistor RM and the operational amplifier 10, error states can also be determined when the digital output D1 is in the "digital ONE" state. The circuit arrangement shown in FIG. 2 therefore offers the option of identifying and diagnosing all possible errors relating to short circuit and cable break at the interface of a load L1 with the electrical connections K11 and K12 and for both digital states at the digital output D1.

Figure 3:
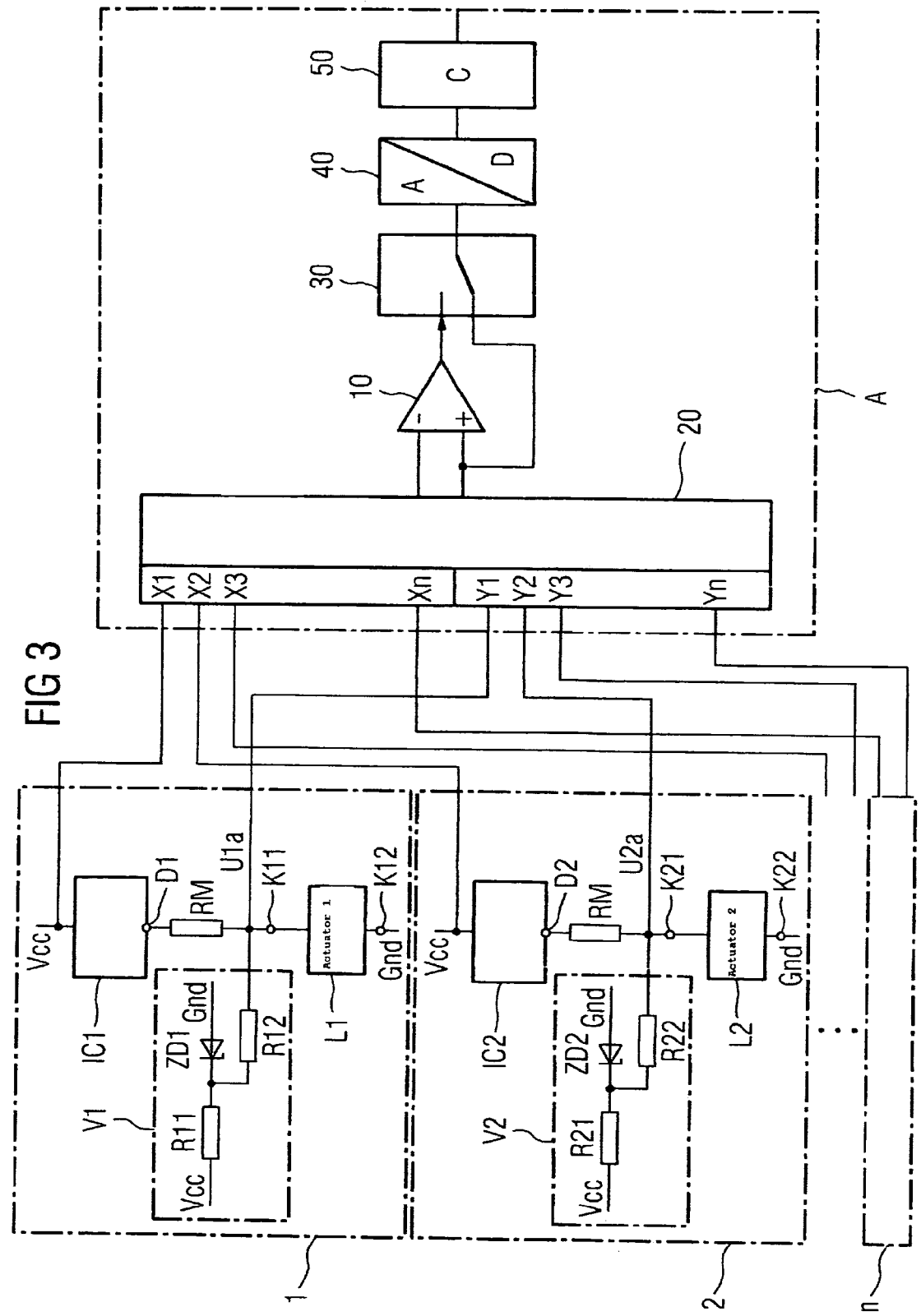
FIG. 3 shows a second example of a circuit arrangement for implementing the inventive method.

FIG. 3 shows a further exemplary embodiment of a possible circuit arrangement for implementing the inventive method, in which in particular a plurality of digital outputs can be monitored by a single common evaluation module A. The evaluation mod-ule A here comprises an integrated differential multiplexer 20 with a downstream operational amplifier 10, an electric changeover switch 30, an analog-digital converter 40 and a controller 50. The voltage values U1a, U2a, ... present at the individual electrical connections K11, K21, ... of then control modules are read by the differential multiplexer 20 at its inputs 41,42, ..., 4n. To verify the possible errors in the "digital ZERO" state, the operational amplifier 10 is bridged as shown in the FIG. by the sub-sequent electric changeover switch 30, so that the read-in voltage values U1a, U2a, ... can be forwarded from the differential multiplexer 20 directly via the analog-digital converter to a subsequent controller for evaluation. The voltage values are then corn-pared in this controller with the reference voltage values stored there and an output signal is generated correspondingly, as in the exemplary embodiments shown in FIGS. 1 and 2, signaling an error state. If the electric changeover switch 30 is in the other position (not shown), error states at "digital one", of the output of the control modules IC1, IC2 can also be identified by means of the operational amplifier 10, as shown in FIG. 2. This circuit arrangement offers the advantage in particular for error diagnosis with a plurality n of digital outputs D1 ,D2,... that error diagnosis can be carried out at all the digital outputs D1, D2, ... with the minimum outlay. The digital outputs to be monitored can thereby all belong to a single control module or as shown in FIG. 3 to n control modules. It is also possible for the digital outputs D1, D2, ... to have the same output value or even different output values or for the connected actuators L1 ,L2,... to have different specifications. This circuit arrangement is therefore characterized in particular by the small component outlay and the high level of flexibility when monitoring a plurality n of digital outputs.

The invention claimed is:

1. A device for identifying a wire break between an electrical connection at a digital output of a control module and a load connected to the electrical connection, the device comprising:
 a digital output for connecting a supply voltage to the load via the electrical connection, the supply voltage directly connected to the load when the digital output is in a "digital ONE" state;
 a voltage limiter module connected to the electrical connection for co-determining a voltage value; and
 an evaluation module connected to the electrical connection for evaluating the voltage value present at the electrical connection, wherein the voltage limiter module and the evaluation module are connected to the electrical connection such that, in the event of a wire break between the electrical connection and the load, the voltage value co-determined by the voltage limiter module is present at the evaluation module, when the digital output is in a first "digital ZERO" state.

2. The device according to claim 1, wherein the voltage limiter module includes a Zener diode, a first resistor, and a second resistor for determining the voltage value.

3. The device according to claim 1, wherein the Zener diode, the first and second resistors are dimensioned as a function of the load.

4. The device according to claim 2, wherein the Zener diode, the first and second resistors are dimensioned as a function of the load.

5. The device according to claim 1, wherein the evaluation module has a first comparator for comparing the voltage value with a first reference voltage value and for determining whether the voltage value is higher than the first reference voltage value.

6. The device according to claim 2, wherein the evaluation module has a first comparator for comparing the voltage value with a first reference voltage value and for determining whether the voltage value is higher than the first reference voltage value.

7. The device according to claim 3, wherein the evaluation module has a first comparator for comparing the voltage value with a first reference voltage value and for determining whether the voltage value is higher than the first reference voltage value.

8. The device according to claim 5, wherein the evaluation module further comprises:
    a second comparator having a second reference voltage value; and
    a third comparator having a third reference voltage value.

9. The device according to claim 1, wherein the evaluation unit comprises a differential multiplexer, an operational amplifier, an electric changeover switch, an analog-digital converter, and a controller.

10. The device according to claim 2, wherein the evaluation unit comprises a differential multiplexer, an operational amplifier, an electric changeover switch, an analog-digital converter, and a controller.

11. The device according to claim 3, wherein the evaluation unit comprises a differential multiplexer, an operational amplifier, an electric changeover switch, an analog-digital converter, and a controller.

12. The device according to claim 1, comprising a plurality of digital outputs and a plurality of voltage limiter modules assigned to the digital outputs, wherein the evaluation unit is commonly assigned to the plurality of digital outputs and voltage limiter modules.

13. A method for identifying a wire break between an electrical connection at one of the digital outputs of a control module and a load connected to the electrical connection, the method comprising:
    connecting a voltage limiter module and an evaluation module to the electrical connection such that, in the event of a wire break between the electrical connection and the load, a voltage value co-determined by the voltage limiter module is present at the evaluation module, when the digital output is in a first "digital ZERO" state;
    comparing the voltage value by the evaluation unit with a first reference voltage value; and
    identifying a wire break, if the voltage value is higher than the first reference voltage value, wherein the digital output connects a supply voltage directly to the load via the electrical connection, when the digital output is in a "digital ONE" state.

* * * * *